United States Patent
Rahman et al.

(10) Patent No.: US 9,698,123 B2
(45) Date of Patent: Jul. 4, 2017

(54) APPARATUS FOR STACKED ELECTRONIC CIRCUITRY AND ASSOCIATED METHODS

(75) Inventors: Arifur Rahman, San Jose, CA (US); Jon M. Long, Livermore, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 65 days.

(21) Appl. No.: 13/235,166

(22) Filed: Sep. 16, 2011

(65) Prior Publication Data
US 2013/0069247 A1 Mar. 21, 2013

(51) Int. Cl.
*H01L 25/065* (2006.01)
*H01L 23/00* (2006.01)
*H05K 3/46* (2006.01)
*H05K 1/14* (2006.01)

(52) U.S. Cl.
CPC ...... *H01L 25/0652* (2013.01); *H01L 25/0657* (2013.01); *H01L 24/16* (2013.01); *H01L 24/17* (2013.01); *H01L 2224/131* (2013.01); *H01L 2224/16145* (2013.01); *H01L 2224/16225* (2013.01); *H01L 2224/1703* (2013.01); *H01L 2225/06513* (2013.01); *H01L 2225/06517* (2013.01); *H01L 2225/06568* (2013.01); *H01L 2924/12042* (2013.01); *H01L 2924/15153* (2013.01); *H01L 2924/15311* (2013.01); *H01L 2924/15321* (2013.01); *H05K 1/141* (2013.01); *H05K 3/4697* (2013.01); *H05K 2201/1053* (2013.01)

(58) Field of Classification Search
CPC ............... H01L 2023/4087; H01L 23/5226
See application file for complete search history.

(56) References Cited

U.S. PATENT DOCUMENTS

| | | | | |
|---|---|---|---|---|
| 5,825,623 | A * | 10/1998 | Lee et al. | 361/707 |
| 6,784,536 | B1 * | 8/2004 | Eslamy | 257/706 |
| 6,906,407 | B2 | 6/2005 | Byers et al. | |
| 8,354,340 | B2 * | 1/2013 | Kurita et al. | 438/620 |
| 2002/0195721 | A1 * | 12/2002 | Lee | H01L 23/49816 257/780 |
| 2003/0036260 | A1 | 2/2003 | Nakamura | |
| 2003/0168256 | A1 | 9/2003 | Chien | |
| 2004/0056344 | A1 | 3/2004 | Ogawa | |
| 2005/0130413 | A1 | 6/2005 | Shimoto et al. | |
| 2005/0167717 | A1 | 8/2005 | Yang et al. | |
| 2010/0210074 | A1 | 8/2010 | Kim et al. | |

FOREIGN PATENT DOCUMENTS

| | | |
|---|---|---|
| CN | 102106194 A | 6/2011 |
| CN | 102148262 A | 8/2011 |

OTHER PUBLICATIONS

U.S. Appl. No. 13/802,698, filed Mar. 13, 2013, Liu.
Office communication in U.S. Appl. No. 13/802,698 (Jun. 18, 2013).
Office communication in U.S. Appl. No. 13/802,698 (May 7, 2015).

* cited by examiner

Primary Examiner — Yu-Hsi D Sun
(74) Attorney, Agent, or Firm — Michael H. Lyons; Tianyi He (57) ABSTRACT

An apparatus includes a substrate and a pair of die that include electronic circuitry. The substrate includes a cavity. One of the die is disposed in the cavity formed in the substrate. The other die is disposed above the first die and is electrically coupled to the first die.

14 Claims, 9 Drawing Sheets

APPARATUS FOR STACKED ELECTRONIC CIRCUITRY AND ASSOCIATED METHODS

TECHNICAL FIELD

The disclosed concepts relate generally to electronic device packaging and fabrication, and more particularly to apparatus for face-to-face bonding or stacking of electronic circuitry or devices, and associated methods.

BACKGROUND

With the advances in circuit and system design, the complexity of electronic circuits, such as the number of integrated devices, has continued to increase. The increased integration has led to smaller devices, increased functionality, smaller device size, and lower cost per unit size or area.

To further increase circuit or device density, sometimes electronic circuits or devices are arranged in a three-dimensional (3D) configuration, or are stacked. By stacking devices, the footprint of the resulting device shrinks. Also, stacking devices may decrease the overall interconnect lengths. Less interconnect length in turn may result in faster signal propagation, less susceptibility to noise, lower power dissipation, etc. In addition, stacking devices in a 3D configuration allows "mixing and matching" devices that perform different functionality, use different technologies, etc.

SUMMARY

In one exemplary embodiment, an apparatus includes a substrate and a pair of die that include electronic circuitry. The substrate includes a cavity. One of the die is disposed in the cavity formed in the substrate. The other die is disposed above the first die and is electrically coupled to the first die.

In another exemplary embodiment, an electronic assembly includes a first semiconductor die that includes electronic circuitry, and a substrate. The substrate includes a cavity that is formed in a surface of the substrate. The cavity is dimensioned for the first semiconductor die to reside in the cavity. The electronic assembly also includes another semiconductor die that includes field programmable gate array (FPGA) circuitry, and is disposed above and bonded to the first semiconductor die.

In yet another exemplary embodiment, a method of fabricating an electronic assembly includes fabricating a substrate having a cavity, and disposing a die in the cavity. The method further includes disposing another die above the first die, and bonding the two die together.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to electronic device packaging and fabrication. More specifically, the disclosed concepts relate to apparatus for face-to-face bonding or stacking of electronic circuitry or devices, and associated methods.

Figure 1:
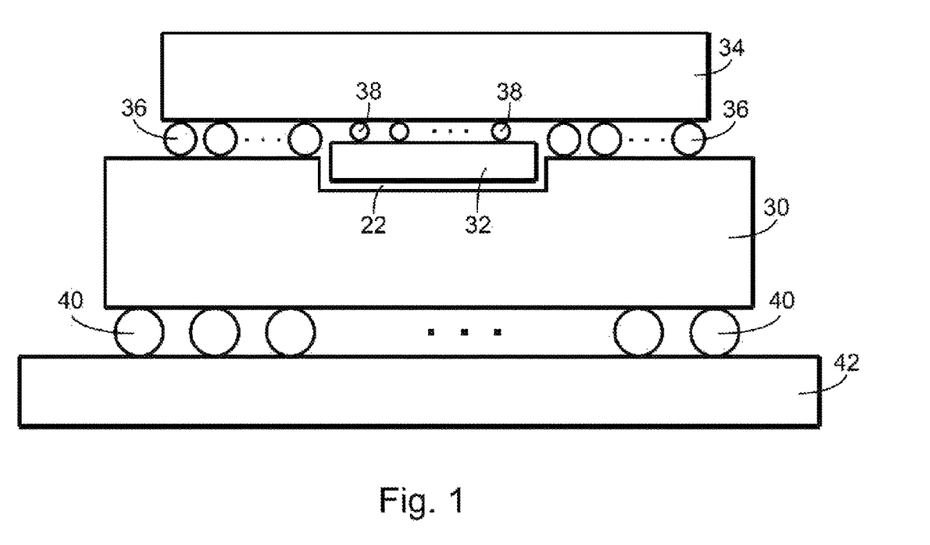
FIG. 1 illustrates a device with stacked semiconductor die according to an exemplary embodiment.

One aspect of the disclosure concerns stacked semiconductor die, where one die resides in a cavity or trench, and the other die is disposed or located above the cavity. The two die may have mechanical bonding and/or electrical coupling between them. FIG. 1 illustrates a device with stacked semiconductor die according to an exemplary embodiment.

Specifically, the device in FIG. 1 includes semiconductor die 32 and semiconductor die 34. Die 32 resides in a cavity or trench 22 in a substrate 30. In exemplary embodiments, cavity 22 may be formed in a surface of substrate 30 (e.g., in build-up layers), such as the top surface of substrate 30.

Cavity 22 has dimensions (width, length, and depth) that allow die 22 to be inserted, disposed, or placed in or within cavity 22. Note that FIG. 1 shows die 32 as not completely residing within cavity 22 as merely an aid to the presentation of details, and that various items in FIG. 1 are not necessarily drawn to scale. In exemplary embodiments, cavity 22 may have a depth such that the top surface of die 22 is level or substantially level (i.e., co-planar or substantially co-planar, such that tolerances do not adversely affect the fabrication of the device and/or the bonding between the two die) with the top surface of substrate 30.

Generally speaking, the dimensions of cavity 22 depend on the dimensions of die 32. The device in FIG. 1 provides the advantage that die 32 need not be made thinner in order for cavity 22 to accommodate die 32. Thus, one may select dimensions of cavity 22 such that many different types and sizes of die 32 may be accommodated. In exemplary embodiments, cavity 22 may have a depth of 100 to 300 microns (micrometers). The dimensions for the depth of cavity 22 are not necessary exact. In some embodiments, cavity 22 may have a depth of approximately 100 microns to approximately 300 microns. In other embodiments, other values may be used.

Nevertheless, in some embodiments, die 32 may be made thinner (either post-fabrication, or by selecting a thinner initial semiconductor substrate for die 32) so as to reduce the depth of cavity 22, as desired. This arrangement may be desirable, for example, when die 32 has a relatively large thickness, and the available technology or fabrication tools cannot accommodate die 32 without modification to reduce its thickness.

Die 32 is coupled electrically (and bonded mechanically) to die 34 via coupling mechanism 38. Coupling mechanism 38 may include a suitable mechanism for electrically coupling circuitry in or on die 32 to circuitry in or on die 34, for example, solder balls, solder bumps, micro bumps, and the like, as persons of ordinary skill in the art understand. During the soldering phase(s), coupling mechanism 38 forms a mechanical bond and electrical coupling between die 32 and die 34.

Die 34 is coupled electrically (and bonded mechanically) to substrate 30 via coupling mechanism 36. Coupling mechanism 36 may include a suitable mechanism for electrically coupling circuitry in or on die 34 to circuitry or interconnect in or on substrate 30. Examples include solder balls, solder bumps, flip-chip bumps, and the like, as persons of ordinary skill in the art understand. During the soldering phase(s), coupling mechanism 36 forms a mechanical bond and electrical coupling between die 34 and substrate 30.

As described below in detail, in exemplary embodiments, substrate 30 includes interconnect layers and vias (not shown in FIG. 1). Coupling mechanism 36 provides a way for circuitry on or in die 34 to couple to various interconnects or vias on or in substrate 30. In exemplary embodiments, substrate 30 includes a core (not shown in FIG. 1) on or within which interconnects or vias are formed, as described below in detail.

In exemplary embodiments, substrate 30 may couple to a circuit carrier, board, or substrate 42. Circuit carrier 42 may be a suitable device to connect physically and couple electrically to circuitry, interconnects, and/or vias in die 32, die 34, and/or substrate 30. In exemplary embodiments, circuit carrier 42 may be a printed circuit board (PCB), thick-film substrate, and the like, as persons of ordinary skill in the art understand. Circuit carrier 42 may include a variety of layers, vias, and the like, as desired, depending on factors such as the complexity of the interconnects to be accommodated, etc.

In addition to substrate 30, circuit carrier 42 may couple electrically (and mechanically, as desired) to a variety of other devices and electrical circuitry (not shown in FIG. 1). Examples include integrated circuits (ICs), interconnect (e.g., edge connectors), discrete devices (both active (e.g., transistors, diodes) and passive (resistors, inductors, capacitors)). In this manner, circuit carrier and the circuitry included in or on die 32 and die 34 may provide the functionality of a complete system, sub-system, or block, as desired.

One aspect of the disclosure relates to techniques for fabricating a device that includes or uses the die-to-die coupling or bonding shown in FIG. 1 between die 32 and die 34, with die 32 and die 34 disposed in a stacked configuration. FIGS. 2-6 illustrate various steps of such techniques according to exemplary embodiments. More specifically, FIGS. 2-6 show cross-sections of the core, substrate, build-up layers, etc., during various fabrication steps or stages.

As noted above, in exemplary embodiments, substrate 30 (see FIG. 1) has a core. The core of substrate 30 is processed in order to form and add build-up layers to the top and/or bottom surfaces of substrate 30. As described below in detail, the build-up layers may include one or more dielectric layers, one or more metal layers (for interconnect), and one or more solder-mask layers (and possibly other layers, depending on a particular application). Fabrication may begin by either using a substrate 30 that already includes a core and build-up layers fabricated, or by using a base core and fabricating the build-up layers.

Figure 2:
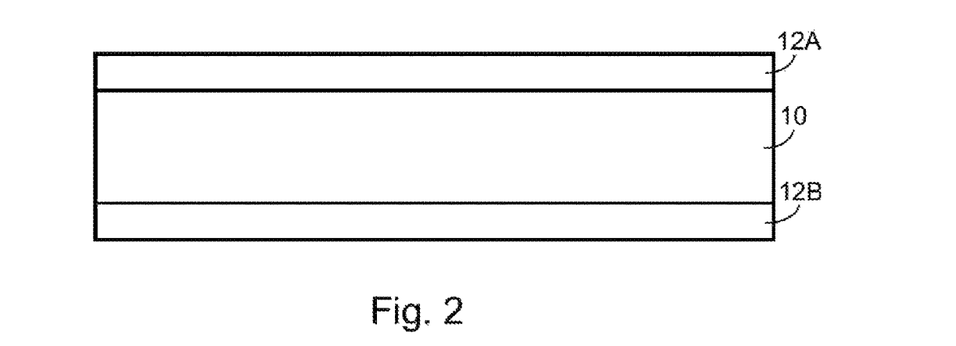
FIGS. 2-6 depict various steps of a technique for fabricating a device with stacked semiconductor die according to an exemplary embodiment.

FIG. 2 shows the situation where fabrication begins with a core 10 for substrate 30 (see FIG. 1). Referring to FIG. 2, core 10 may have a desired thickness, and be made of a suitable material. Generally, the thickness of core 10 is selected so as to provide the desired mechanical properties, such as rigidity, resistance to mechanical stress (e.g., twisting or flexing), etc. Core 10 may be made of a suitable material, such as fiberglass, as persons of ordinary skill in the art understand.

In exemplary embodiments, a dielectric layer 12A is fabricated or deposited on the top surface of core 10 (see FIG. 2). Similarly, a dielectric layer 12B is fabricated or deposited on the bottom surface of core 10. Dielectric layers 12A-12B may be fabricated using a suitable material, and may have a desired or suitable thickness. In some situations, using the same thickness for layers 12A-12B may help to provide improved mechanical stability and avoid or decrease susceptibility to mechanical stress, such as warping or twisting of core 10 during fabrication, processing (e.g., connection with or soldering to circuit carrier 42 (see FIG. 1)), and/or use.

Figure 3:
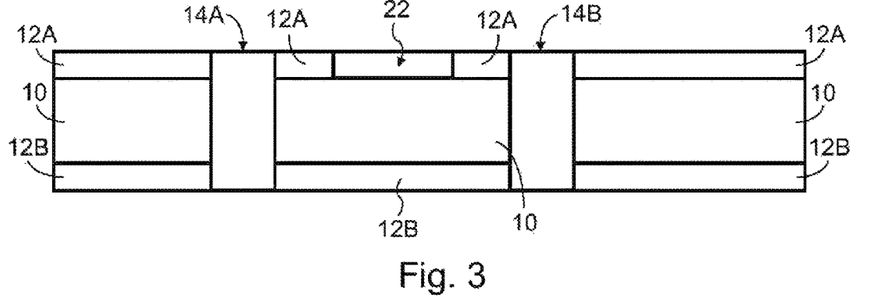

Referring to FIG. 3, a desired number of vias may be fabricated. FIG. 3 shows an example of two vias 14A-14B, although other numbers of vias may be fabricated. Vias 14A-14B are formed or fabricated by making openings in dielectric layers 12A-12B and core 10. Vias 14A-14B may be fabricated using a suitable technique, such as photolithography or removal by using a laser (or other techniques) of the appropriate portions of core 10 and dielectric layers 12A-12B, as persons of ordinary skill in the art understand.

In addition, cavity 22 (the part of cavity 22, if any, that may reside in the dielectric layer) is fabricated in dielectric layer 12A. More specifically, a portion of dielectric layer 12A is removed to open cavity 22. Cavity 22 may be fabricated using a suitable technique, such as photolithography or removal by using a laser (or other techniques) of the appropriate portions of dielectric layer 12A, as persons of ordinary skill in the art understand.

As noted above, substrate 30 includes mechanisms or interconnect for coupling the semiconductor die together and/or to the circuit carrier, other circuitry, etc. In exemplary embodiments, such interconnect may be fabricated by using one or more metal layers on either side of core 10. In exemplary embodiments, the metal layer(s) are fabricated on both the top and bottom sides of core 10, as described below.

Figure 4:
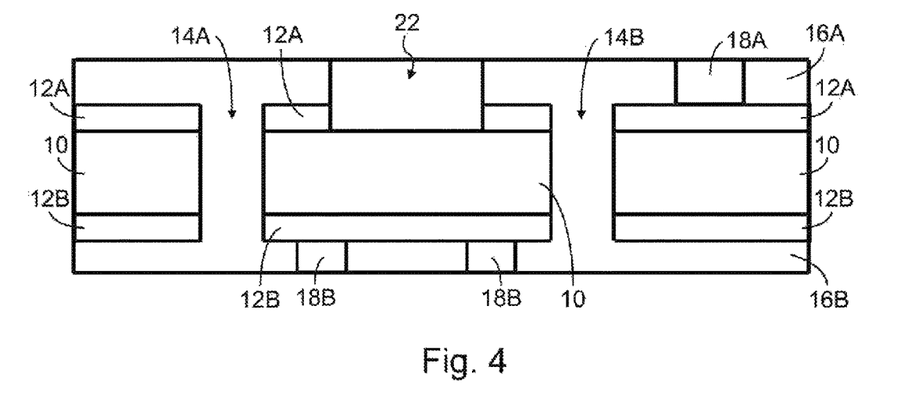

Referring to FIG. 4, a metal layer 16A is fabricated or deposited on the top surface of core 10, i.e., above dielectric layer 12A. Similarly, a metal layer 16B is fabricated or deposited on the bottom surface of core 10, i.e., above dielectric layer 12B (core 10 may be turned over in order to deposit metal layer 16B).

Metal layers 16A-16B may be fabricated using a suitable material, and may have a desired or suitable thickness. In some situations, using the same thickness for layers 16A-16B may help to provide improved mechanical stability and avoid or decrease susceptibility to mechanical stress, such as warping or twisting of core 10 during fabrication, processing (e.g., connection with or soldering to circuit carrier 42 (see FIG. 1)), and/or use.

Metal layers 16A-16B may be patterned appropriately to provide the desired interconnect or coupling mechanism. The patterns depend on the desired circuit topology and interconnect. In the exemplary embodiment shown in FIG. 4, an opening or void 18A is made in metal layer 16A to produce an interconnect pattern. Similarly, an opening or void 18B is made in metal layer 16B to produce an interconnect pattern. During the fabrication of metal layers 16A-16B, vias 14A-14B may be plated with metal, as persons of ordinary skill in the art understand. Metal layers 16A-16B may be patterned using a suitable technique, such as photolithography or removal by using a laser (or other techniques) of the appropriate portions of metal layers 16A-16B, as persons of ordinary skill in the art understand.

As persons of ordinary skill in the art understand, any desired or appropriate number of openings may be fabricated to pattern metal layers 16A-16B. FIG. 4 shows openings 18A and 18B to merely provide examples. The choice of the number and location of the openings depends on factors such as circuit topology, interconnect layout, the number of metal layers available, etc., as persons of ordinary skill in the art understand. Similar to openings 18A-18B, the desired number of openings may be fabricated by using a suitable technique, such as photolithography or removal by using a laser (or other techniques) of the appropriate portions of metal layers 16A-16B, as persons of ordinary skill in the art understand.

In addition, cavity 22 (the part of cavity 22, if any, that resides within metal layer 16A) is fabricated in metal layer 16A. More specifically, a portion of metal layer 16A is removed to open cavity 22. Put another way, cavity 22 is fabricated layer by layer, as fabrication of the overall structure shown in FIG. 1 progresses. Cavity 22 may be fabricated using a suitable technique, such as photolithography or removal by using a laser (or other techniques) of the appropriate portions of metal layer 16A, as persons of ordinary skill in the art understand.

As noted, in some embodiments, additional metal layers and/or vias may be fabricated by depositing additional layers of dielectric and metal, and fabricating desired interconnect patterns. The number of metal and dielectric layers depends on factors such as circuit complexity, the desired number of vias and interconnects, and the like, as persons of ordinary skill in the art understand. In such embodiments, the opening for cavity 22 (the part of cavity 22, if any, that resides within such layers) is extended to the additional dielectric and metal layers by removing appropriate portions of those layers, as described above.

Figure 5:
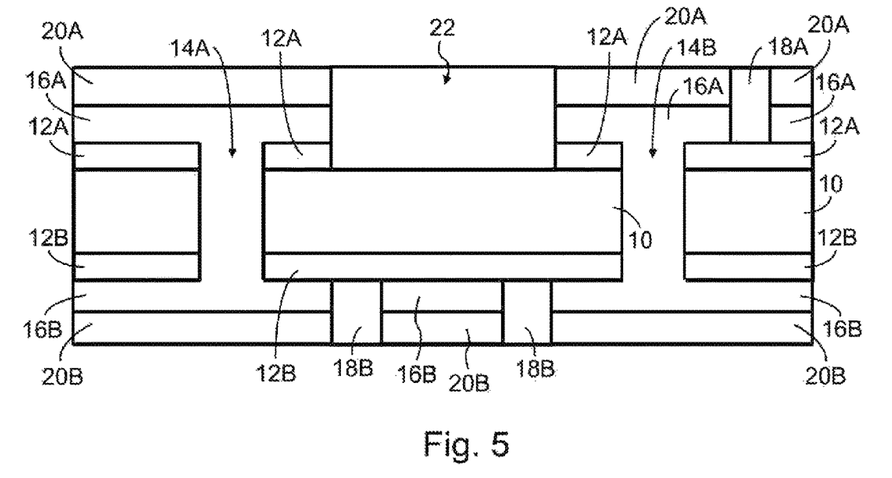

Referring to FIG. 5, a solder-mask layer 20A is fabricated or deposited on the top surface of core 10, i.e., above metal layer 16A. Similarly, a solder-mask layer 20B is fabricated or deposited on the bottom surface of core 10, i.e., above metal layer 16B (core 10 may be turned over for fabrication on the bottom side). In exemplary embodiments, solder-masks layers 20A-20B may have a thickness in the range of approximately 25 microns to approximately 50 microns, although other values may be used.

Solder-mask layers 20A-20B provide the functionality that is well understood by persons of ordinary skill in the art. For example, solder-mask layers 20A-20B help prevent electrical shorts and unwanted mechanical bonds between adjacent interconnect traces during the soldering of various components.

Solder-mask layers 20A-20B may be fabricated using a suitable material, and may have a desired or suitable thickness. In some situations, using the same thickness for layers 20A-20B may help to provide improved mechanical stability and avoid or decrease susceptibility to mechanical stress, such as warping or twisting of core 10 during fabrication, processing (e.g., connection with or soldering to circuit carrier 42 (see FIG. 1)), and/or use.

Solder-mask layers 20A-20B may be patterned appropriately to help provide the desired interconnect or coupling mechanism to metal layers 16A-16B, respectively. The patterns depend on the desired circuit topology and interconnect, as noted above. In the exemplary embodiment shown in FIG. 5, openings 18A and 18B are extended to solder-mask layers 20A-20B, respectively. The openings may be filled during the soldering phase(s) (to couple die 34 to die 32, and substrate 30 to circuit carrier 42, etc.). Solder-mask layers 20A-20B may be patterned using a suitable technique, such as photolithography or removal by using a laser (or other techniques) of the appropriate portions of solder-mask layers 20A-20B, as persons of ordinary skill in the art understand.

In addition, cavity 22 (the part of cavity 22 that resides within solder-mask 20A) is fabricated in solder-mask layer 20A. More specifically, a portion of solder-mask layer 20A is removed to open cavity 22. Cavity 22 may be fabricated using a suitable technique, such as photolithography or removal by using a laser (or other techniques) of the appropriate portions of solder-mask layer 20A, as persons of ordinary skill in the art understand.

In some embodiments, more than one solder-mask layer may be deposited on the top and bottom of core 10. For example, as described below in detail, in some embodiments, die 32 (see FIG. 1) may reside within a cavity 22, fabricated in a plurality of solder-mask layers, that does not extend to the underlying metal and dielectric layers.

Figure 6:
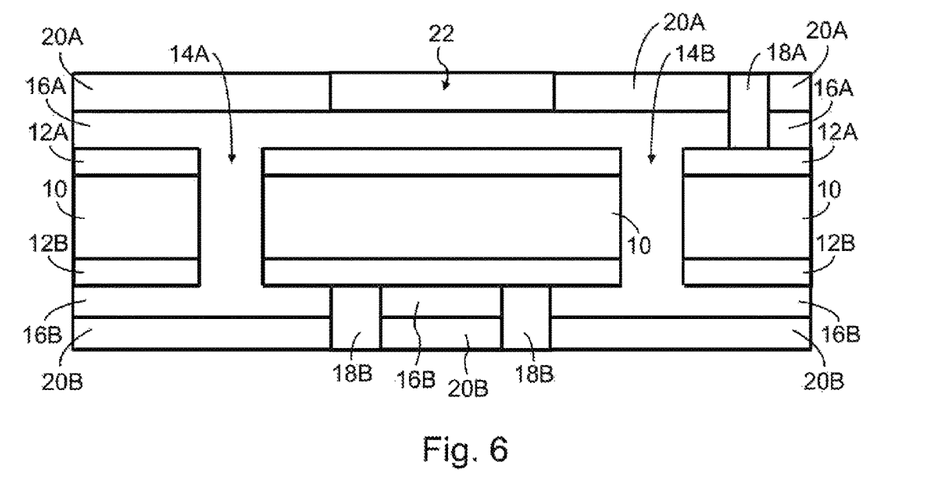

Referring to FIG. 6, cavity 22 is formed within one or more solder-mask layers 20A. More specifically, cavity 22 exists within solder-mask layer(s) 20A, but not within metal layer 16A and dielectric layer 12A. This configuration somewhat simplifies the fabrication of cavity 22. Fabrication of cavity 22 involves etching or removing portions of solder-mask layer(s) 20A, rather than solder-mask layer(s) 20A in addition to metal layer 16A and dielectric layer 12A.

In some embodiments, more than two die may be stacked. Such embodiments provide for increased flexibility of the type and configuration of electrical circuitry that may be used. For instance, one stacked die may include digital circuitry, whereas another stacked die may include analog circuitry. As another example, one stacked die may include circuitry realized using a silicon-based technology, whereas another stacked die may include circuitry realized using another semiconductor, such as gallium arsenide (GaAs), silicon germanium (SiGe), and the like.

As yet another example, one die may include circuitry realized using a fabrication technology with a particular feature size (e.g., 90 nm), whereas another stacked die may include circuitry realized using a fabrication technology with a different feature size (e.g., 45 nm). Using these techniques, a flexible way for providing functionality in a variety of semiconductor technologies may be provided.

In some embodiments, circuitry implemented using the stacked die may provide different or complementary functionality. For example, one stacked die (e.g., die 32 in FIG. 1) may include application specific IC (ASIC) circuitry, system on a chip (SoC), and the like, whereas another stacked die (e.g., die 34 in FIG. 1) may include field programmable gate array (FPGA) circuitry. In this manner, the ASIC (or SoC) can provide some parts of the overall system functions with lower area and power dissipation overhead (albeit with less flexibility), whereas the FPGA provide other parts of the overall system function with increased flexibility, programmability or configurability.

Figure 7:
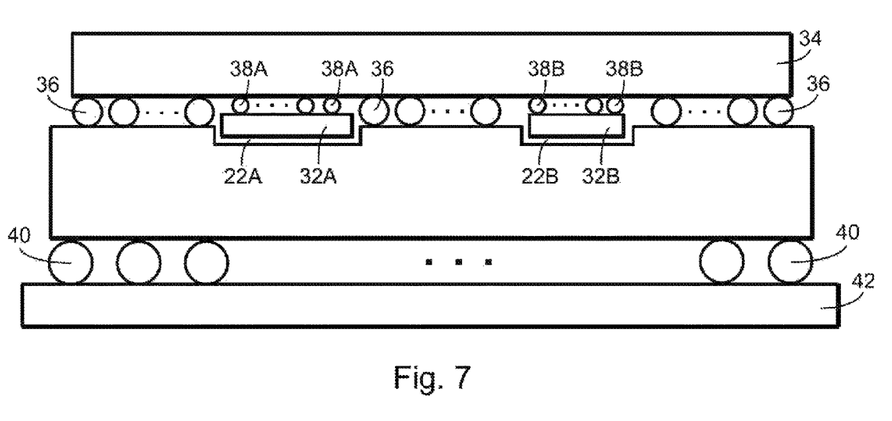
FIG. 7 shows a device according to an exemplary embodiment with a semiconductor die stacked above multiple semiconductor die.

FIG. 7 shows one die stacked above two die, according to an exemplary embodiment. More specifically, die 34 is stacked above die 32A and die 32B. Die 32A and die 32B reside, respectively, within cavity 22A and cavity 22B. Cavities 22A-22B may be fabricated using the techniques described above.

Coupling mechanism 38A provides a way for die 34 to electrically couple to and communicate with the circuitry on or in die 32A. Similarly, coupling mechanism 38B provides a way for die 34 to electrically couple to and communicate with the circuitry on or in die 32B. Other features of the device in FIG. 7 may be similar to the features of the device shown in FIG. 1. Through interconnect formed on or in die

34, circuitry in die 32A may be coupled to circuitry in die 32B. In this way, a complete system, sub-system, or block may be provided in a flexible manner.

Note that the configuration shown in FIG. 7 provides merely an example, and many variations are possible, as persons of ordinary skill in the art understand. For example, rather than two die stacked below die 34, a larger number of die may be used. As another example, rather than using one die 34 stacked above die 32A-32B, two die 34A-34B may be stacked above two die 32A-32B, respectively.

Devices with stacked semiconductor die according to various embodiments may be used to produce systems with desired functionality. By using die that include circuitry with a wide range and type of circuitry, flexible mechanisms for producing complex systems are provided. The coupling mechanisms (see, for example, coupling mechanisms 36, 38, and 40 in FIGS. 1 and 7) provide a flexible mechanism for signal flow between the various die, as FIG. 8 illustrates.

Specifically, interconnect or coupling mechanism 138 (which may include one or more of coupling mechanisms 36, 38, and 40 in FIGS. 1 and 7) allows circuitry included in or on die 32 to communicate with circuitry included in or on die 34. The direction of communication may be simplex, half-duplex, or full-duplex (as shown in FIG. 8), as desired. In situations where more than one die (e.g., die 32A and die 32B in FIG. 7) are used, interconnect 138 may be extended to provide communication and coupling between those die and die 34.

Figure 8:
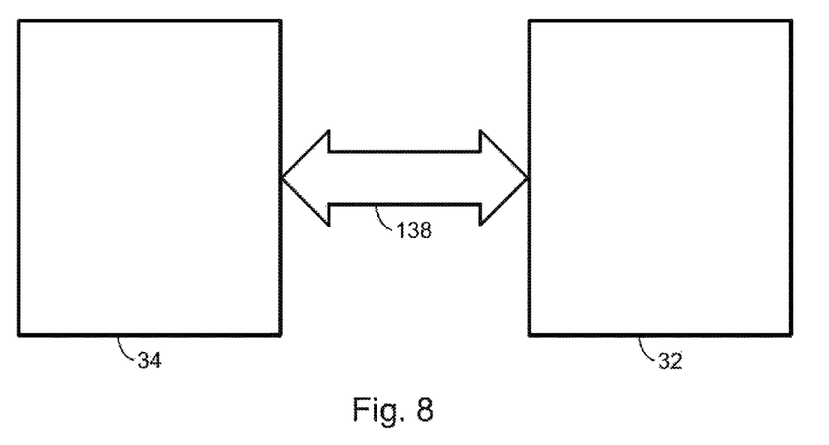
FIG. 8 illustrates a signal flow or electrical interconnection or coupling between stacked die according to an exemplary embodiment.

Referring to FIG. 8, in some embodiments, some or all of interconnect 138 may be configurable. Thus, either during the design, manufacture, and/or use of a device that includes die 32 and die 34 the type, function, number, etc. of the lines and signals in interconnect 138 may be determined or realized. For example, in some embodiments, the characteristics of interconnect 138 may be determined during the design phase of the device. In some other embodiments, the characteristics of interconnect 138 may be determined during the manufacture phase of the device (e.g., by using fuses, anti-fuses, etc.).

In other embodiments, the characteristics of interconnect 138 may be determined during the use of the device. For example, as noted above, die 34 (see FIG. 1 or FIG. 7) may include FPGA circuitry. The functions of the FPGA circuitry may be programmed by the end-user. More specifically, the end-user may program the functionality of some of the interconnect in the FPGA. By realizing part of interconnect 138 using the resources of the FPGA, the user can use the FPGA computer aided design (CAD) software flow to determine at least some of the characteristics and functionality of interconnect 138.

Of course, a combination of one or more of the above techniques may be used. In other words, the characteristics of interconnect 138 may be determined during more than one of the design, manufacture, and use phases of the device.

Figure 9:
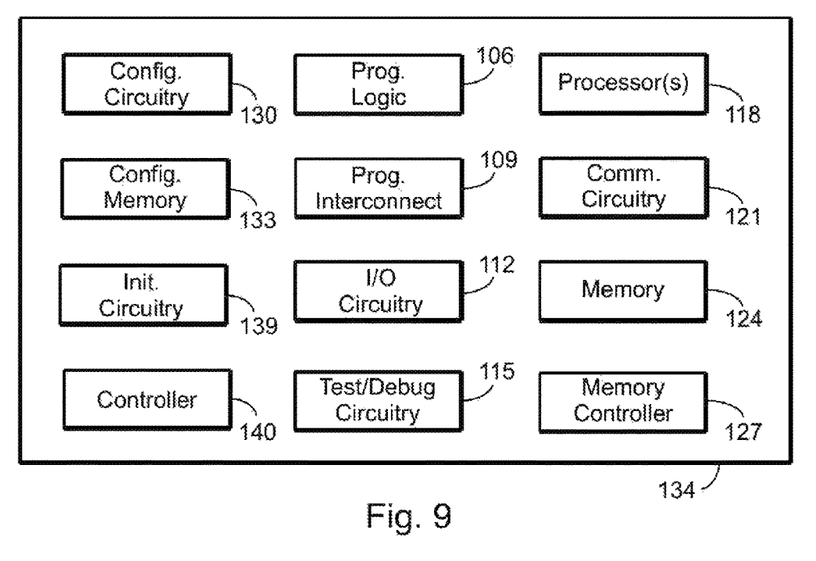
FIG. 9 depicts a block diagram of a field-programmable gate array (FPGA) used in exemplary embodiments.

As noted above, in some embodiments, one or more of the stacked die may include FPGA circuitry. FIG. 9 illustrates a general block diagram of an FPGA 134 that may be used in such embodiments. FPGA 134 includes configuration circuitry 130, configuration memory (CRAM) 133, controller 140, programmable logic 106, programmable interconnect 109, and I/O circuitry 112. In addition, FPGA 134 may include test/debug circuitry 115, one or more processors 118, one or more communication circuitry 121, one or more memories 124, one or more controllers 127, and initialization circuit 139, as desired. In some embodiments, FPGA 134 may also include one or more voltage regulators or power supply circuits (not shown).

Note that the figure shows a general block diagram of FPGA 134. Thus, FPGA 134 may include other blocks and circuitry, as persons of ordinary skill in the art understand. Examples of such circuitry include clock generation and distribution circuits, and the like. Furthermore, FPGA 134 may include analog circuitry, other digital circuitry, and/or mixed-signal circuitry, fuses, anti-fuses, and the like, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 134 (for example, by using pass gates and/or MUXs). In some embodiments, programmable logic 106 and/or programmable interconnect 109 may include fuses and/or anti-fuses to provide additional flexibility or programmability.

Initialization circuit 139 may cause the performance of various functions at reset or power-up of FPGA 134. At or after power-up, FPGA 134 obtains configuration information, typically from an external device. Based on the configuration information, various blocks or devices within the FPGA core or fabric, or other blocks or resources in FPGA 134, are configured or programmed. Examples include programmable logic 106 and programmable interconnect 109. Part of the circuitry in programmable interconnect 109 may be used to realize interconnect 138 in FIG. 8, i.e., one or more interconnects with other die in a stacked-die device.

Referring to FIG. 9, I/O circuitry 112 may constitute a wide variety of I/O devices or circuits. I/O circuitry 112 may couple to various parts of FPGA 134, for example, programmable logic 106 and programmable interconnect 109. I/O circuitry 112 provides a mechanism and circuitry for various blocks within FPGA 134 to communicate with external circuitry or devices, such as other die in a device, as desired.

Test/debug circuitry 115 facilitates the testing and troubleshooting of various blocks and circuits within FPGA 134. Test/debug circuitry 115 may include a variety of blocks or circuits known to persons of ordinary skill in the art. For example, test/debug circuitry 115 may include circuits for performing tests after FPGA 134 powers up or resets, as desired. Test/debug circuitry 115 may also include coding and parity circuits, as desired.

FPGA 134 may include one or more processors 118. Processor 118 may couple to other blocks and circuits within FPGA 134. Processor 118 may receive data and information from circuits within or external to FPGA 134 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired. Processor(s) 118 may operate in cooperation with circuitry included in other die within a stacked-die device, for example, ASIC circuitry included in a die.

FPGA 134 may also include one or more communication circuit(s) 121. Communication circuit(s) 121 may facilitate data and information exchange between various circuits within FPGA 134 and circuits external to FPGA 134, as persons of ordinary skill in the art understand. Examples of communication circuit 121 include transceivers, network interface circuits, etc.

FPGA 134 may further include one or more memories 124 and one or more memory controller(s) 127. Memory 124 allows the storage of various data and information (such as user-data, intermediate results, calculation results, etc.) within FPGA 134. Memory 124 may have a granular or block form, as desired. Similar to processor(s) 118, memory 124 may operate in cooperation with circuitry included in other die within a stacked-die device, for example, ASIC circuitry included in a die.

Memory controller 127 allows interfacing to, and controlling the operation and various functions of, circuitry outside the FPGA. For example, memory controller 127 may interface to and control an external synchronous dynamic random access memory (SDRAM). The external SDRAM may be located in other die within a stacked-die device, for example, ASIC circuitry included in a die.

By using the various resources of FPGA 134, together with circuitry included in other die in a stacked die device, a wide variety of functions, such as entire systems, may be realized. Such systems may operate in cooperation with (or include) sensors, transducers, input/output devices (e.g., displays, keyboards), and the like. Furthermore, such systems may produce, process, or provide a wide variety of signals and types of signals, such as analog, digital, and mixed-signal.

As persons of ordinary skill in the art understand, one may apply the disclosed concepts effectively to various types of circuitry or die. Examples described in this document constitute merely illustrative applications, and are not intended to limit the application of the disclosed concepts to other types of devices or die by making appropriate modifications. Those modifications fall within the knowledge and level of skill of persons of ordinary skill in the art. For example, rather than FPGA circuitry realized in a semiconductor die, other types of circuitry, known for instance as programmable logic device (PLD), complex PLD (CPLD), and the like, may be used.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus comprising:
   a substrate comprising a non-metallic core having a plurality of vias formed therein, a dielectric layer on the non-metallic core, a metal layer on the dielectric layer, and a solder mask layer on the metal layer, wherein the metal layer has a surface, and a cavity is formed in the substrate that extends beyond the planar surface of the metal layer and through the solder mask layer;
   a first die comprising electronic circuitry, the first die being disposed in the cavity in the substrate and attached to the substrate; and
   a second die comprising electronic circuitry, wherein the second die is disposed above the first die, is electrically coupled to the first die, and is electrically coupled to the plurality of vias in the non-metallic core.

2. The apparatus according to claim 1, wherein the cavity is formed in a surface of the substrate facing the second die.

3. The apparatus according to claim 2, wherein the cavity has a depth of approximately 100 microns to approximately 300 microns.

4. The apparatus according to claim 1, wherein the cavity has dimensions that fit the first die.

5. The apparatus according to claim 1, wherein a top surface of the first die is co-planar with a top surface of the substrate.

6. The apparatus according to claim 1, wherein the plurality of vias extend completely through the non-metallic core.

7. The apparatus according to claim 6, wherein the first die is directly coupled to the second die via an interconnect.

8. The apparatus according to claim 7, wherein the non-metallic core includes only a single planar surface that surround the cavity.

9. An electronic assembly comprising:
   a first semiconductor die comprising electronic circuitry;
   a substrate comprising a non-metallic core comprising a plurality of vias and having a planar surface, a dielectric layer on the planar surface of the non-metallic core, a metal layer on the dielectric layer, and a solder mask layer on the metal layer, wherein a cavity is formed in a first surface of the substrate and extends to the planar surface of the non-metallic core through the dielectric layer, the metal layer, and the solder mask layer, the cavity being dimensioned for the first semiconductor die to reside in the cavity and to be attached to the substrate;
   a second semiconductor die comprising field programmable gate array (FPGA) circuitry, wherein the second semiconductor die is disposed above the first surface of the substrate, is bonded directly to the first semiconductor die via an interconnect, and is electrically coupled to the plurality of vias in the non-metallic core.

10. The electronic assembly according to claim 9, wherein the electronic circuitry in the first semiconductor die comprises application specific integrated circuit (ASIC) circuitry.

11. The electronic assembly according to claim 9, wherein the field programmable gate array (FPGA) circuitry comprises programmable interconnect circuitry, and wherein the programmable interconnect circuitry may be adapted to provide a configurable electrical interconnect between the first and second semiconductor die.

12. The electronic assembly according to claim 9, wherein the cavity has a depth and wherein a top surface of the first semiconductor die is co-planar with the first surface of the substrate when the first semiconductor die is placed in the cavity.

13. The electronic assembly according to claim 9, wherein the plurality of vias extend completely through the non-metallic core.

14. The electronic assembly according to claim 13, further comprising:
  a circuit carrier that is coupled to a given via of the plurality of vias, wherein the circuit carrier is disposed below the substrate.

* * * * *